(12) United States Patent
Padmanabhan et al.

(10) Patent No.: US 6,723,593 B1
(45) Date of Patent: Apr. 20, 2004

(54) DEEP SUBMICRON MOS TRANSISTOR WITH INCREASED THRESHOLD VOLTAGE

(75) Inventors: Gobi R. Padmanabhan, Sunnyvale, CA (US); Visvamohan Yegnashankaran, Redwood City, CA (US); Reda Razouk, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 8 days.

(21) Appl. No.: 10/185,960

(22) Filed: Jun. 27, 2002

(51) Int. Cl.[7] .......................................... H01L 21/8238
(52) U.S. Cl. .................... 438/199; 438/223; 438/227; 438/301; 438/305; 438/307; 438/174
(58) Field of Search ................................ 438/174, 301, 438/305, 307, 227, 199, 223

(56) References Cited

FOREIGN PATENT DOCUMENTS

JP          410012870 A  *  1/1998  ........... H01L/29/78

* cited by examiner

*Primary Examiner*—Matthew Smith
*Assistant Examiner*—V. Yevsikov
(74) *Attorney, Agent, or Firm*—Mark C. Pickering

(57) ABSTRACT

A deep submicron MOS transistor is formed with multiple control gates by forming side wall control gates adjacent to the gate oxide spacers over heavily-doped regions of the source and drain regions. The side wall control gates can be used to substantially increase the threshold voltage of the transistor.

20 Claims, 6 Drawing Sheets

DEEP SUBMICRON MOS TRANSISTOR WITH INCREASED THRESHOLD VOLTAGE

BACKGROUND OF THE INVENTION

1. Field of the Invention

The present invention relates to deep submicron MOS transistors and, more particularly, to a deep submicron MOS transistor with an increased threshold voltage.

2. Description of the Related Art

FIG. 1A shows a plan view that illustrates a prior-art NMOS transistor 100. FIG. 1B shows a cross-sectional diagram taken along line 1B—1B of FIG. 1A. As shown in FIGS. 1A and 1B, transistor 100, which is formed in a p-type substrate 110, includes spaced-apart n+ source and drain regions 112 and 114 that are formed in substrate 110, and a channel region 116 that is located between source and drain regions 112 and 114. Source and drain regions 112 and 114, and channel region 116 define an active region.

In addition, transistor 100 includes a gate oxide layer 120 that is formed over channel region 116, and a gate 122 that is formed on gate oxide layer 120 over channel region 116. Transistor 100 also includes a side wall spacer 124 is formed next to and around gate 122 over lower doped regions of source and drain regions 112 and 114. Further, the active region is isolated from adjacent devices by a field oxide region FOX that is formed in substrate 110.

One problem with transistor 100 is that when transistor 100 is formed in a deep submicron fabrication process, such as a 0.12-micron process, using conventional process steps, transistor 100 can end up having a threshold voltage of about 0.25V with an operating voltage of about 1.2V.

With a threshold voltage this low, it is very difficult to form closely-matched (ideally-matched) MOS transistors, which is a common requirement in analog circuits, because small variations in a 0.12-micron process have a much bigger impact than do the same variations in, for example, a 0.35-micron process.

In addition, when ground is applied to gate 122 of transistor 100 to turn off transistor 100, small noise spikes in the 0.3V range can inadvertently turn on transistor 100. Thus, there is a need for deep submicron MOS transistors that have increased threshold voltages without sacrificing or limiting the current characteristics (e.g., $ID_{SAT}$) of the transistor.

SUMMARY OF THE INVENTION

The present invention provides a deep submicron MOS transistor with a substantially increased threshold voltage. A transistor in accordance with the present invention is formed in a semiconductor material of a first conductivity type, and has spaced-apart source and drain regions of a second conductivity type that are formed in the semiconductor material.

The source region includes a first lightly-doped region, and a first heavily-doped region that is formed in the first lightly-doped region. In addition, the source region includes a second heavily-doped region that adjoins the first lightly-doped region and is spaced apart from the first heavily-doped region.

The drain region includes a second lightly-doped region, and a third heavily-doped region that is formed in the second lightly-doped region. In addition, a fourth heavily-doped region adjoins the second lightly-doped region and is spaced apart from the third heavily-doped region.

The transistor can also include a channel region that is located between the source and drain regions, and a gate oxide layer that is formed over the channel region, the source region, and the drain region. Further, a channel gate is formed on the gate oxide layer over the channel region.

In addition, the transistor can include a side wall spacer that adjoins the side walls of the channel gate, and a side wall gate that adjoins the side wall spacer over the first heavily-doped region. The transistor can further include a gate side wall that adjoins the side wall spacer over the third heavily-doped region. The side wall gate and the gate side wall can be electrically isolated from each other.

The present invention also includes a method of using the MOS transistor. The transistor has ground is applied to the second heavily-doped region, a first positive voltage applied to the fourth heavily-doped region; and a second positive voltage applied to the channel gate. The second positive voltage is equal to or greater than a minimum voltage that is required to invert the channel region of the MOS transistor.

In addition, the transistor is biased off by inducing a first potential substantially equal to ground in the first heavily-doped region, and a second potential substantially equal to ground in the third heavily-doped region. Further, the MOS transistor can be biased from off to on by inducing a third potential equal to or greater than a minimum value on the first heavily-doped region. In addition, a fourth potential equal to or greater than a minimum value is induced on the third heavily-doped region. The fourth potential is greater than the potential required to invert the channel region of the MOS transistor.

The present invention also includes a method of forming a MOS transistor in a semiconductor material of a first conductivity type. The transistor has a layer of gate oxide that is formed over the semiconductor material, and a gate that is formed on the layer of gate oxide over a region of the semiconductor material.

The method includes the step of implanting the semiconductor material with a dopant of the second conductivity type to form a lightly-doped source region and a lightly-doped drain region. In addition, the method includes the steps of forming a side wall spacer that adjoins the side walls of the gate, and forming a side wall gate on the layer of gate oxide to adjoin the side wall spacer over the lightly-doped source region and the lightly-doped drain region.

The method can further include the step of implanting the lightly-doped source region to form to form a heavily-doped source pocket region of the second conductivity type in the lightly-doped source region under the side wall gate. The method can additionally include the step of implanting the lightly-doped drain region to form to form a heavily-doped drain pocket region of the second conductivity type in the lightly-doped drain region under the gate side wall.

Further, the method can include the step of forming a heavily-doped source region of the second conductivity type that adjoins the lightly-doped source region and is spaced away from the source pocket region, and a heavily-doped drain region of the second conductivity type that adjoins the lightly-doped drain region and is spaced away from the drain pocket region.

A better understanding of the features and advantages of the present invention will be obtained by reference to the following detailed description and accompanying drawings that set forth an illustrative embodiment in which the principles of the invention are utilized.

DETAILED DESCRIPTION

Figure 1A:
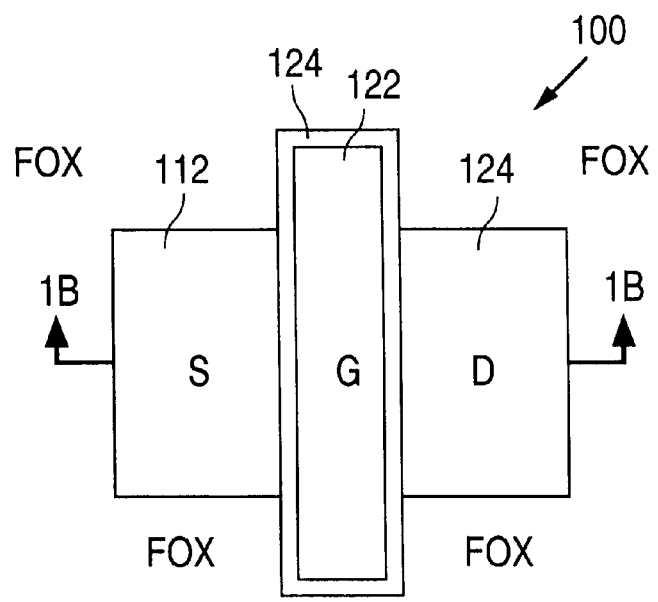
FIG. 1A is a plan view illustrating a prior-art NMOS transistor 100.
Figure 1B:
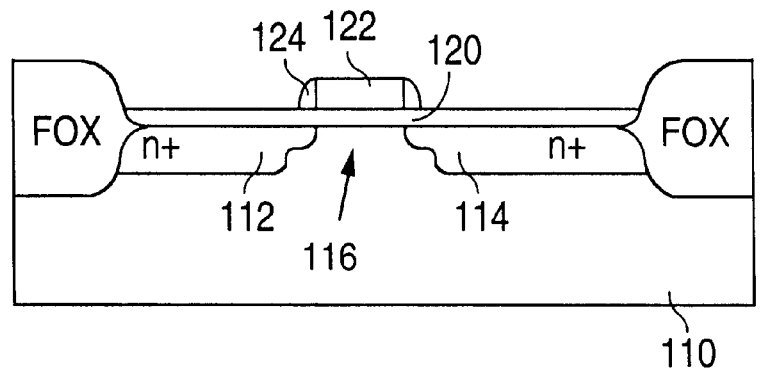
FIG. 1B is a cross-sectional diagram taken along line 1B—1B of FIG. 1A.
Figure 2A:
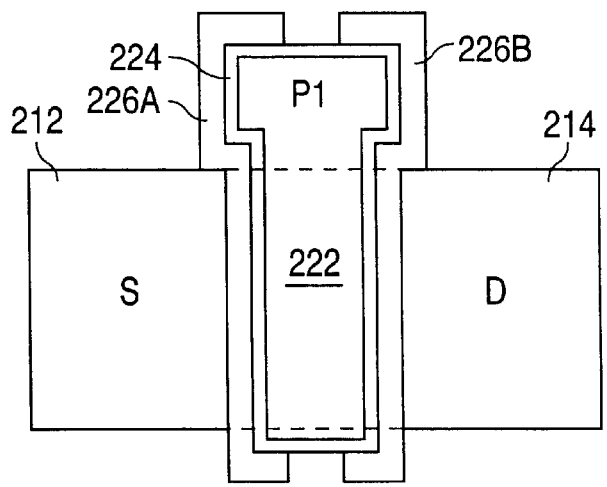
FIG. 2A is a plan view illustrating an example of a MOS transistor 200 in accordance with the present invention.
Figure 2B:
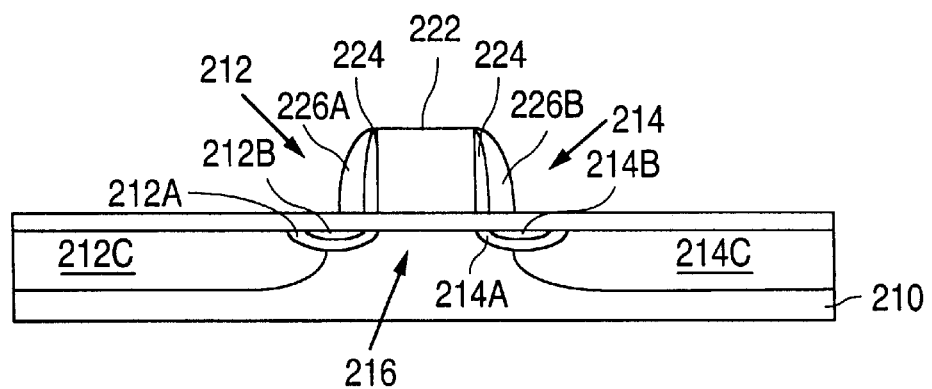
FIG. 2B is a cross-sectional view taken along line 2B—2B of FIG. 2A.
Figure 2C:
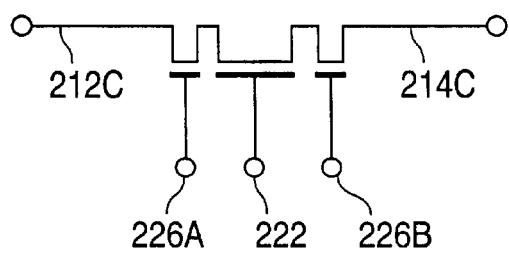
FIG. 2C is a schematic diagram representing transistor 200 in accordance with the present invention.

FIG. 2A shows a plan view that illustrates an example of a MOS transistor 200 in accordance with the present invention. FIG. 2B shows a cross-sectional view taken along line 2B—2B of FIG. 2A. FIG. 2C shows a schematic diagram that represents transistor 200 in accordance with the present invention. As described in greater detail below, MOS transistor 200 increases the threshold voltage of a deep submicron transistor by utilizing side gates and underlying pocket implants.

As shown in FIGS. 2A–2C, transistor 200, which is formed in a p-type substrate 210, includes spaced-apart n+ source and drain regions 212 and 214 that are formed in substrate 210. Source region 212 includes a lightly-doped source region 212A, a heavily-doped source region 212B that is formed in region 212A, and a heavily-doped region 212C that adjoins lightly-doped region 212A and is spaced apart from heavily-doped region 212B.

Similarly, drain region 214 includes a lightly-doped region 214A, a heavily-doped region 214B that is formed in region 214A, and a heavily-doped region 214C that adjoins lightly-doped region 214A and is spaced apart from heavily-doped region 214B. As described in greater detail below, the dopant concentrations of heavily-doped regions 212B and 214B set the threshold voltage of transistor 200.

Transistor 200 also includes a channel region 216 that is located between source and drain regions 212 and 214. In addition to the above, transistor 200 also includes a gate oxide layer 220 that is formed over channel region 216, source region 212, and drain region 214, and a channel gate 222 that is formed on gate oxide layer 220 over channel region 216.

Further, transistor 200 includes an insulating side wall spacer 224 that adjoins the side walls of channel gate 222 over lightly-doped regions 212A and 214A. Transistor 200 additionally includes a first side wall gate 226A and a second side wall gate 226B. First side wall gate 226A adjoins side wall spacer 224 over heavily-doped source region 212B, while second side wall gate 226B adjoins side wall spacer 224 over heavily-doped drain region 214B. (In a first alternate embodiment, gates 226A and 226B are connected together to form a single gate. In a second alternate embodiment, transistor 200 can be formed to have only one side wall gate, gate 226A or 226B.)

Figure 3A:
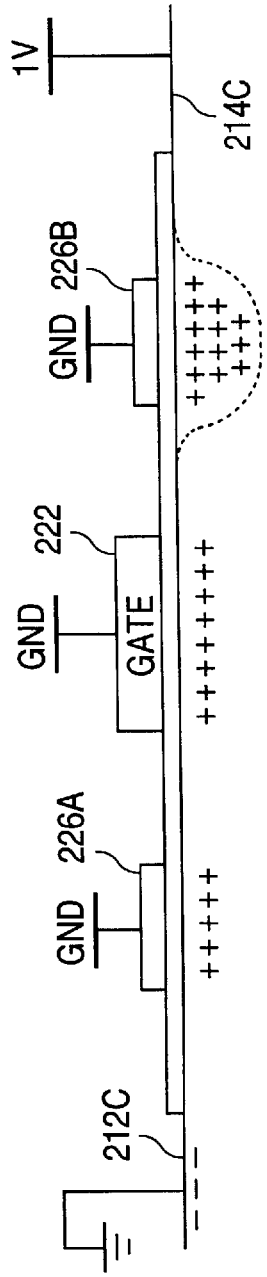
FIGS. 3A–3D are graphical diagrams illustrating an example of the operation of transistor 200 in accordance with the present invention.

FIGS. 3A–3D show graphical diagrams that illustrate an example of the operation of transistor 200 in accordance with the present invention. As shown in FIG. 3A, transistor 200 is turned off when ground is applied to n+ source region 212C, channel gate 222, first side wall gate 226A, and second side wall gate 226B, and 1.0V is applied to n+ drain region 214C.

In this case, transistor 200 is turned off for three reasons. The first reason is that when ground is applied to channel gate 222, the top surface of channel region 216 is populated with holes that are attracted to the ground potential on gate 222. Thus, a conductive channel can not form at the surface of channel region 216 when ground is placed on channel gate 222.

The second reason that transistor 200 is turned off is that ground is placed on both n+ source region 212C and first side wall gate 226A. When ground is placed on first side wall gate 226A and the capacitive coupling is high, a potential substantially equal to ground is induced in the region under gate 226A (n+ source region 212B). Since no current will flow between two points which have the same potential, no appreciable current will flow from the region under side wall gate 226A (n+ source region 212B) to n+ source region 212C.

The third reason that transistor 200 is turned off is that ground is placed on second side wall gate 226B and 1V is placed on n+ drain region 214C. When ground is placed on second side wall gate 226B, a potential substantially equal to ground is induced in the region under gate 226B (n+ drain region 214B). Due to the positive voltage on drain region 214C, the region under gate 226B becomes locally depleted of electrons which, in turn, results in a net positive charge being located under gate 226B.

Thus, the present invention provides a MOS transistor with three gate controls, i.e., channel gate 222, first side wall gate 226A, and second side wall gate 226B, rather than the one gate control that is common with standard MOS transistors. In addition, a minimum voltage must be present on each gate 222, 226A, and 226B before transistor 200 will turn on.

As a result, the threshold voltage of transistor 200 is defined by which of the three gates 222, 226A, and 226B requires the largest minimum voltage. The minimum voltages required by gates 226A and 226B, in turn, are defined by the doping concentrations of regions 212B and 214B, respectively.

Figure 3B:
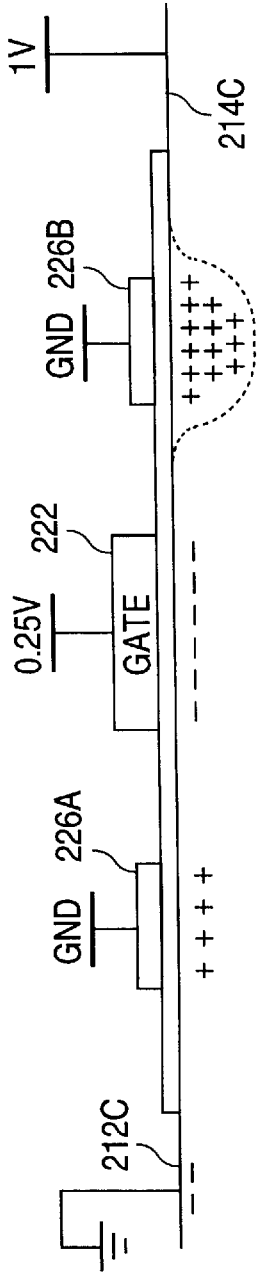

As shown in FIG. 3B, when 0.25V is applied to channel gate 222, the top surface of channel region 216 inverts and becomes dominated by electrons of sufficient numbers to create a conductive channel. However, because ground remains applied to first side wall gate 226A and second side wall gate 226B, transistor 200 remains turned off.

Figure 3C:
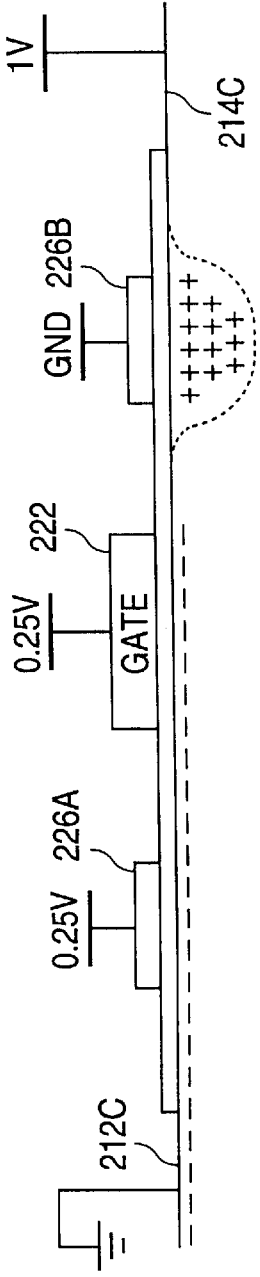

As shown in FIG. 3C, when heavily-doped region 212B has been doped to have a minimum voltage requirement of 0.25V, and 0.25V is applied to both channel gate 222 and first side wall gate 226A, the top surface of channel region 216 inverts, and a conductive path is established from n+ source region 212C to the region under channel gate 222. However, because ground remains applied to second side wall gate 226B, transistor 200 remains turned off.

Figure 3D:
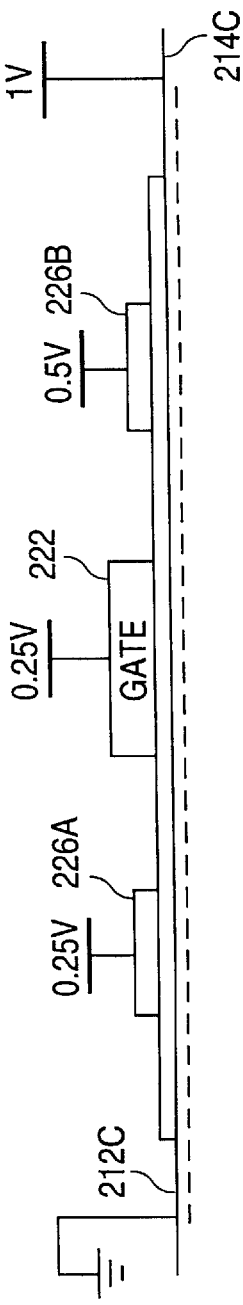

As shown in FIG. 3D, when heavily-doped region 214B has been doped to have a minimum voltage requirement of 0.5V, and 0.5V is applied to second side wall gate 226B (when 0.25V are applied to channel gate 222 and first side wall gate 226A), the region below gate 226B again becomes populated with electrons sufficient enough to turn on transistor 200. As a result, electrons can flow from source region 212C to drain region 214C.

One application of the present invention is as a deep submicron MOS transistor that has a high threshold voltage that allows good matching for analog circuits. As noted above, MOS transistors formed with a 0.12-micron photolithographic process can have threshold voltages of approximately 0.25V.

In this example, the present invention solves this issue by allowing the second side wall gate to function as the typical control gate. For example, channel gate 222 and first side wall gate 226A can be electrically connected together, and to a voltage, such as 0.25V, which is sufficient to invert the surface of channel region 216 and form a conductive path from source region 212C to channel region 216.

The signal which would normally be applied to the gate of a conventional transistor to turn the transistor on is now applied to second side wall gate 226B. By selecting the proper doping concentrations of heavily-doped drain region 214B, transistor 200 can be formed to turn on when 0.5V are applied to second side wall gate 226B.

Thus, in this example, transistor 200 has an effective threshold voltage of 0.5V. A higher threshold voltage, in turn, allows better matching and prevents transistor 200 from improperly turning on when a 0.3V noise spike is present on a line connected to ground.

Transistor 200 can be operated in a number of different ways, the above description being but one example. For example, the minimum voltage required by gate 226A can be used to turn transistor 200 off and on. The minimum voltages required by gates 226A and 226B can be set to be the same or different.

As another example, the dopant concentration can be set so that the top surface of channel region 216 under channel gate 222 inverts when a low-positive, ground, or negative voltage is placed on channel gate 222 (forming a low-threshold enhancement or depletion type region of transistor 200).

Further, in accordance with the present invention, transistor 200 can be operated as a single transistor AND gate. For example, when gates 226A and 226B require the same minimum turn on voltage, which is greater than the voltage required by gate 222 to invert the channel, transistor 200 will not turn on unless the minimum voltages required by gates 226A and 226B have both been met.

Figure 4A:
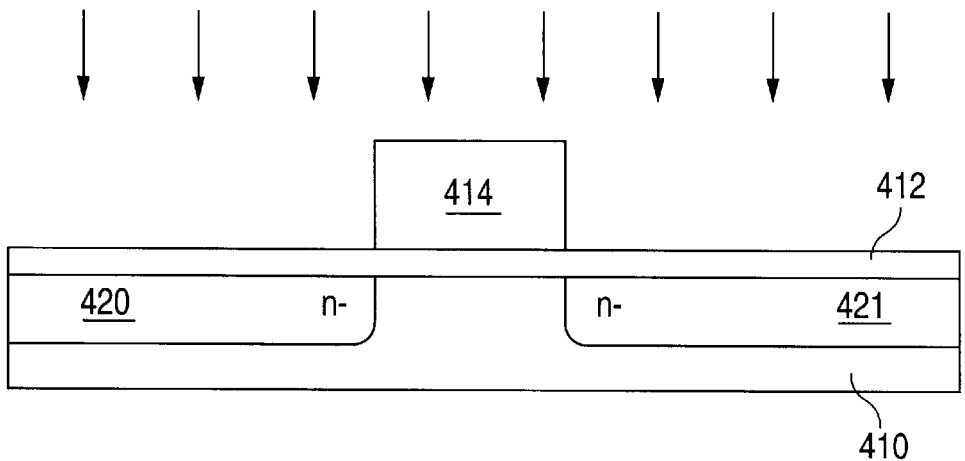
FIGS. 4A–4F are a series of cross-sectional diagrams illustrating an example of a method of forming transistor 200 in accordance with the present invention.

FIGS. 4A–4F show a series of cross-sectional diagrams that illustrate an example of a method of forming transistor 200 in accordance with the present invention. As shown in FIG. 4A, the present invention utilizes a conventionally formed wafer than includes a p-type semiconductor material 410, such as a well or substrate, and a layer of gate oxide 412 that has been formed over the surface of material 410. In addition, a polysilicon gate 414 is formed on gate oxide layer 412 over a region of material 410.

Figure 4B:
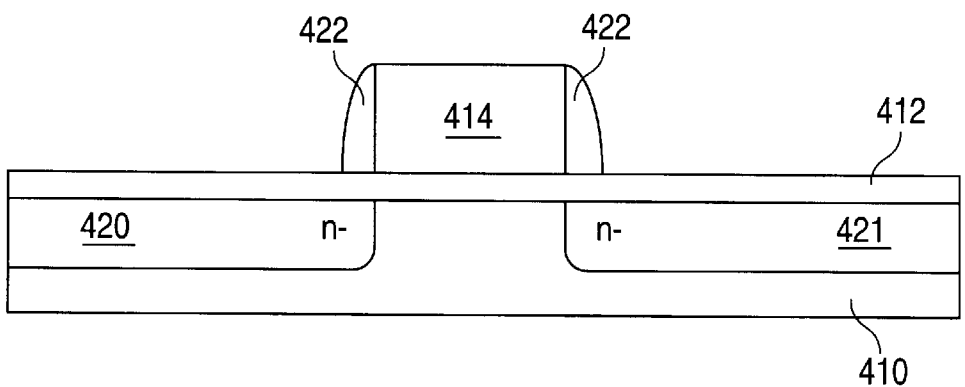

As further shown in FIG. 4A, the method begins by implanting material 410 with an n-type material to form a lightly-doped source region 420 and a lightly-doped drain region 421. Following this, a layer of oxide is deposited over the surface of the wafer. Next, as shown in FIG. 4B, the layer of oxide is anisotropically etched back to form an oxide side wall spacer 422.

Figure 4C:
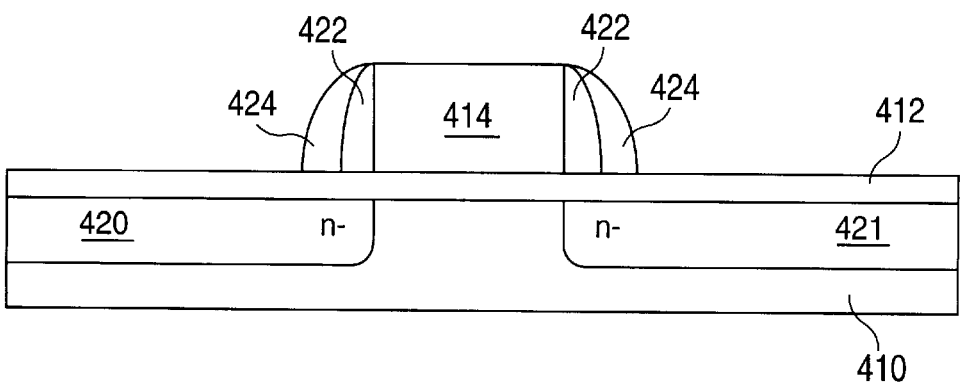
Figure 4D:
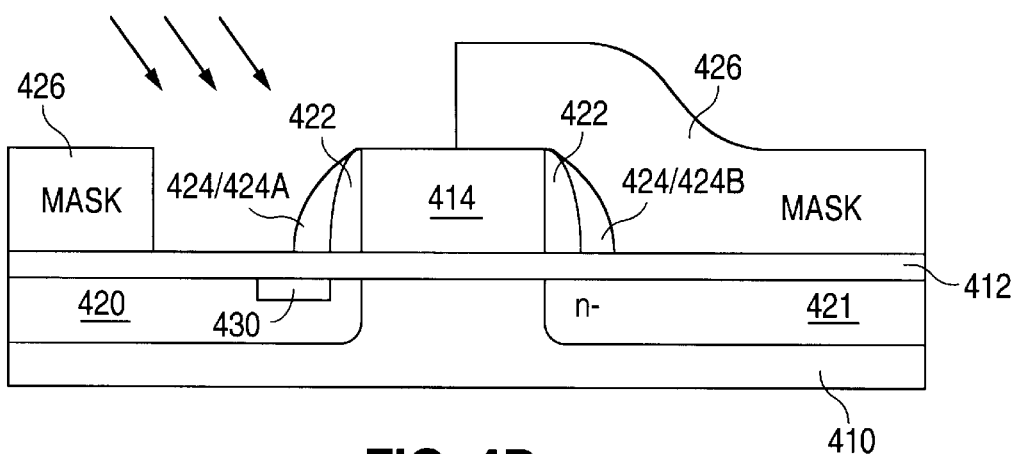
Figure 5:
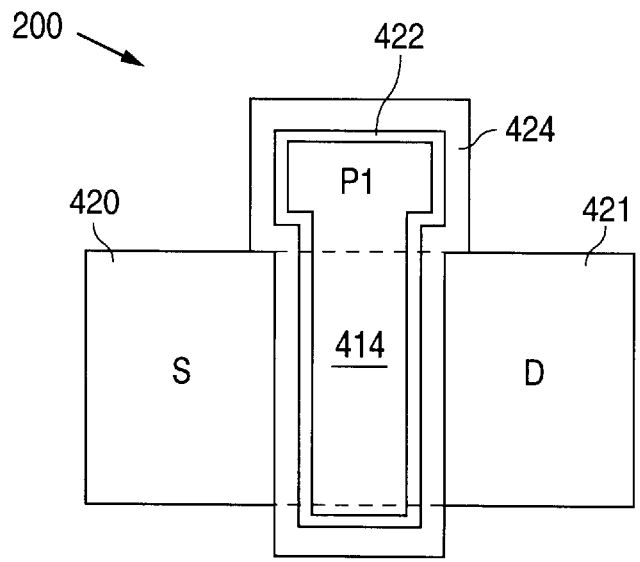
FIG. 5 is a plan view illustrating an example of transistor 200 following the formation of poly spacer 424.

Following this, a layer of polysilicon (poly) is deposited over the surface of the wafer. Next, as shown in FIG. 4C, the poly layer is anisotropically etched back to form a poly side wall spacer 424. FIG. 5 shows a plan view that illustrates an example of transistor 200 following the formation of poly spacer 424.

As shown in FIG. 5, at this point, poly spacer 424 represents both first side wall gate 226A and second side wall gate 226B. In one embodiment of the present invention, first and second side wall gates 226A and 226B are electrically connected together. Thus, for this embodiment, fabrication can continue.

In a second embodiment of the present invention, first and second side wall gates 226A and 226B are not electrically connected together. Thus, at some point in the process, poly spacer 424 must be etched to form two separate regions. For example, a layer of masking material can be formed and patterned to define a mask that exposes to-be-etched regions of poly spacer 424.

Figure 6:
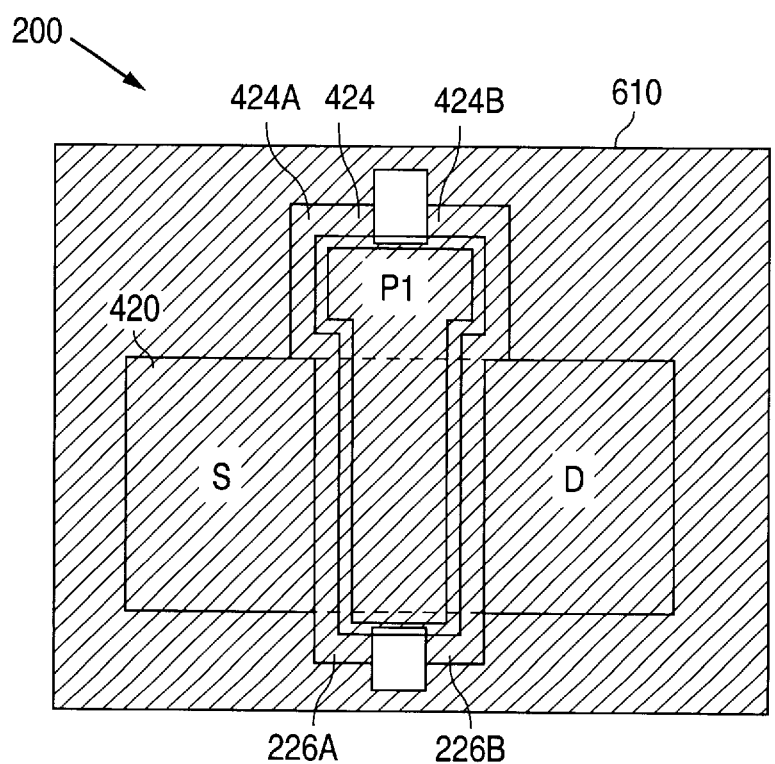
FIG. 6 is a plan view illustrating an example of transistor 200 after a mask has been formed in accordance with the present invention.

FIG. 6 shows a plan view that illustrates an example of transistor 200 after a mask has been formed in accordance with the present invention. As shown in FIG. 6, a mask 610 is formed on poly spacer 424 with openings that expose to-be-etched regions. Following this, the exposed regions of poly spacer 424 are etched until the exposed regions of poly spacer 424 have been removed, thereby forming poly spacers 424A and 424B. Mask 610 is then removed.

Returning again to FIG. 4D, once poly spacer 424 or spacers 424A and 424B have been formed, a layer of masking material is formed and patterned to define a mask 426. After this, the wafer is implanted at a first angle with an n-type material to form an n+ source pocket region 430 in source region 420. In the present invention, the dopant concentration of source pocket region 430 defines the minimum voltage required by the to-be-formed side gate to form a conductive channel in region 430. Mask 426 is then removed.

Figure 4E:
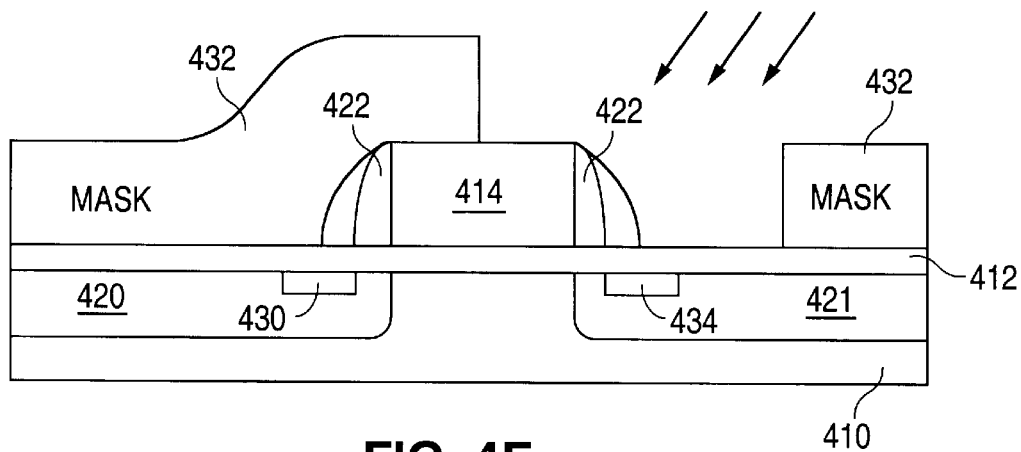

Following this, as shown in FIG. 4E, a layer of masking material is formed and patterned to define a mask 432. After this, the wafer is implanted at a second angle with an n-type material to form an n+ drain pocket region 434 in drain region 421. As above, the dopant concentration of drain pocket region 434 defines the minimum voltage required by the to-be-formed side gate to form a conductive channel in region 434. Mask 432 is then removed.

Figure 4F:
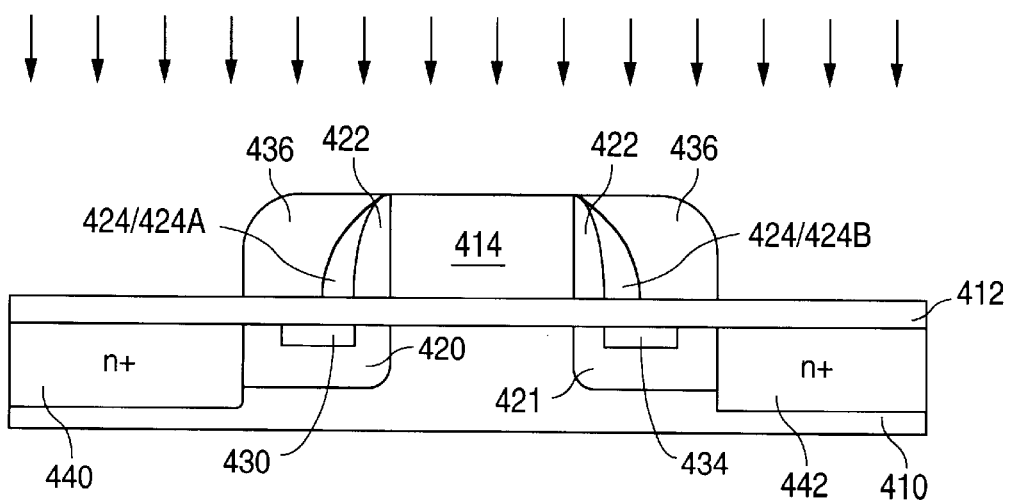

Following this, a second layer of oxide is deposited over the surface of the wafer. Next, as shown in FIG. 4F, the layer of oxide is anisotropically etched back to form an oxide side wall spacer 436. Once spacer 436 has been formed, material 410 is implanted with an n-type dopant to form a n+ source region 440 and a n+ drain region 442. Following this, the method continues with conventional MOS processing steps.

Thus, in accordance with the present invention, a deep submicron MOS transistor has been described with side gates that provide a substantially larger threshold voltage than conventional deep submicron MOS transistors. The increased threshold voltage allows better matching and prevents the transistor from turning on in response to 0.3V voltage spikes.

It should be understood that the above description is of an example of the present invention, and that various alternatives to the embodiment of the invention described herein may be employed in practicing the invention.

For example, although the operation of the present invention has been described with respect to NMOS transistors, the present invention applies equally well to PMOS transistors. In addition, the present invention is not limited to deep sub-micron (approximately 0.13 micron and below) fabrication processes, but can also be used with larger fabrication processes. Thus, it is intended that the following claims define the scope of the invention and that methods and structures within the scope of these claims and their equivalents be covered thereby.

What is claimed is:

1. A transistor formed in a semiconductor material of a first conductivity type, the transistor comprising:

spaced-apart source and drain regions of a second conductivity type formed in the semiconductor material, the source region includes:
a first lightly-doped region,
a first heavily-doped region that is formed in the first lightly-doped region, and
a second heavily-doped region that adjoins the first lightly-doped region and is spaced apart from the first heavily-doped region; and the drain region includes:
a second lightly-doped region,
a third heavily-doped region that is formed in the second lightly-doped region, and
a fourth heavily-doped region that adjoins the second lightly-doped region and is spaced apart from the third heavily-doped region.

2. The transistor of claim 1 and further comprising:
a channel region located between the source and drain regions;
a gate oxide layer formed over the channel region, and
a channel gate formed on the gate oxide layer over the channel region, the channel gate having side walls.

3. The transistor of claim 2 and further comprising:
a side wall spacer adjoining the side walls of the channel gate; and
a first outer gate adjoining the side wall spacer formed over the first heavily-doped region.

4. The transistor of claim 3 wherein the first outer gate is also formed over the third heavily-doped region.

5. The transistor of claim 3 and further comprising a second outer gate adjoining the side wall spacer formed over the third heavily-doped region, the first outer gate and the second outer gate being electrically isolated from each other.

6. The transistor of claim 5 wherein the first outer gate and the second outer gate are electrically connected together.

7. A method of using a MOS transistor formed in a semiconductor material of a first conductivity type, the transistor having:
spaced-apart source and drain regions of a second conductivity type formed in the semiconductor material, the source region includes:
a first lightly-doped region,
a first heavily-doped region that is formed in the first lightly-doped region, and
a second heavily-doped region that adjoins the first lightly-doped region and is spaced apart from the first heavily-doped region; and the drain region includes:
a second lightly-doped region,
a third heavily-doped region that is formed in the second lightly-doped region, and
a fourth heavily-doped region that adjoins the second lightly-doped region and is spaced apart from the third heavily-doped region;

a channel region located between the source and drain regions;
a gate oxide layer formed over the channel region, and
a channel gate formed on the gate oxide layer over the channel region, the channel gate having side walls;
ground applied to the second heavily-doped region;
a first positive voltage applied to the fourth heavily-doped region; and a second positive voltage applied to the channel gate, the second positive voltage being equal to or greater than a voltage required to invert the channel region of the MOS transistor;

the transistor being biased off by:
inducing a first potential in the first heavily-doped region that is substantially equal to ground, and
inducing a second potential in the third heavily-doped region that is substantially equal to ground.

8. The method of claim 7 wherein the MOS transistor is biased from off to on by inducing
a third potential in the first heavily-doped region that is equal to or greater than a minimum potential required to form a channel, and
a fourth potential on the third heavily-doped region that is equal to or greater than a minimum potential required to form a channel, the fourth potential being greater than a voltage required to invert the channel region of the MOS transistor.

9. The method of claim 8 wherein the third potential is equal to the fourth potential.

10. The method of claim 8 wherein the third potential is less than the fourth potential.

11. The method of claim 8 wherein the third potential is greater than the fourth potential.

12. The method of claim 8 wherein the MOS transistor is biased from on to off by inducing a potential substantially equal to ground on the third heavily-doped region.

13. The method of claim 8 wherein the MOS transistor is biased from on to off by inducing a potential substantially equal to ground on the first heavily-doped region.

14. A method of forming a MOS transistor in a semiconductor material of a first conductivity type, the transistor having a layer of gate oxide formed over the semiconductor material, and a gate formed on the layer of gate oxide over a region of the semiconductor material, the method comprising the steps of:

implanting the semiconductor material with a dopant of the second conductivity type to form a lightly-doped source region and a lightly-doped drain region;

forming a side wall spacer that adjoins the side walls of the gate; and forming an outer gate on the layer of gate oxide to adjoin the side wall spacer over the lightly-doped source region and the lightly-doped drain region.

15. The method of claim 14 and further comprising the steps of:

implanting the lightly-doped source region to form to form a heavily-doped source pocket region of the second conductivity type in the lightly-doped source region under the outer gate; and implanting the lightly-doped drain region to form to form a heavily-doped drain pocket region of the second conductivity type in the lightly-doped drain region under the outer gate.

16. The method of claim 15 and further comprising the step of forming:

a heavily-doped source region of the second conductivity type that adjoins the lightly-doped source region and is spaced away from the source pocket region, and a heavily-doped drain region of the second conductivity type that adjoins the lightly-doped drain region and is spaced away from the drain pocket region.

17. The method of claim 14 and further comprising the steps of:

etching the outer gate to form a first outer gate and a second outer gate that is electrically isolated from the first outer gate;

implanting the lightly-doped source region to form to form a heavily-doped source pocket region of the second conductivity type in the lightly-doped source region under the side wall gate; and implanting the lightly-doped drain region to form to form a heavily-doped drain pocket region of the second conductivity type in the lightly-doped drain region under the side wall gate.

18. The method of claim 17 and further comprising the step of forming:

a heavily-doped source region of the second conductivity type that adjoins the lightly-doped source region and is spaced away from the source pocket region, and a heavily-doped drain region of the second conductivity type that adjoins the lightly-doped drain region and is spaced away from the drain pocket region.

19. A transistor formed in a semiconductor material of a first conductivity type, the transistor comprising:

spaced-apart diffusion regions of a second conductivity type formed in the semiconductor material, a diffusion region of the spaced-apart diffusion regions having:

a first lightly-doped region, a first heavily-doped region that is formed in the first lightly-doped region, and a second heavily-doped region that adjoins the first lightly-doped region and is spaced apart from the first heavily-doped region;

a channel region located between the source and drain regions;

a gate oxide layer formed over the channel region; and a center gate formed on the gate oxide layer over the channel region, the center gate having side walls.

20. The transistor of claim 19 and further comprising:

a side wall spacer adjoining the side walls of the center gate; and an outer gate adjoining the side wall spacer formed over the first heavily-doped region.

* * * * *